US 6,717,159 B2

(12) United States Patent
Novak

(10) Patent No.: US 6,717,159 B2
(45) Date of Patent: Apr. 6, 2004

(54) LOW DISTORTION KINEMATIC RETICLE SUPPORT

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 304 days.

(21) Appl. No.: 09/952,444

(22) Filed: Sep. 13, 2001

(65) Prior Publication Data
US 2002/0043163 A1 Apr. 18, 2002

Related U.S. Application Data
(60) Provisional application No. 60/241,671, filed on Oct. 18, 2000.

(51) Int. Cl.[7] .............................. A61N 5/00; G21G 5/00; G21K 5/10
(52) U.S. Cl. ................... 250/492.2; 250/442.11
(58) Field of Search .................... 250/492.2, 442.11

(56) References Cited

U.S. PATENT DOCUMENTS

| 3,722,996 | A | | 3/1973 | Fox ........................ 355/53 |
| 3,887,811 | A | * | 6/1975 | Livesay ..................... 250/442 |
| 4,190,325 | A | | 2/1980 | Moreno ..................... 350/253 |
| 4,290,574 | A | | 9/1981 | Archibald ................... 248/177 |
| 4,409,738 | A | | 10/1983 | Renander et al. ............ 33/281 |
| 4,534,047 | A | * | 8/1985 | Deschenaux et al. ......... 378/35 |
| 4,676,630 | A | | 6/1987 | Matsushita et al. .......... 355/53 |
| 4,733,945 | A | | 3/1988 | Bacich ...................... 350/253 |
| 4,780,617 | A | | 10/1988 | Umatate et al. ............. 250/548 |
| 4,782,475 | A | | 11/1988 | Chandler .................... 369/45 |
| 4,842,397 | A | | 6/1989 | Eisler ....................... 350/634 |
| 4,929,073 | A | | 5/1990 | La Plante et al. ........... 350/609 |
| 4,952,858 | A | | 8/1990 | Galburt .................... 318/647 |
| 4,961,115 | A | | 10/1990 | Jessop ...................... 358/229 |
| 4,962,318 | A | | 10/1990 | Nishi ....................... 250/548 |
| 5,153,678 | A | | 10/1992 | Ota ......................... 356/401 |
| 5,157,251 | A | | 10/1992 | Albrecht et al. ............ 250/216 |
| 5,187,519 | A | | 2/1993 | Takabayashi et al. ......... 355/53 |
| 5,270,870 | A | | 12/1993 | O'Brien et al. ............. 359/820 |
| 5,325,180 | A | | 6/1994 | Chappelow et al. .......... 356/401 |
| 5,406,405 | A | | 4/1995 | Sullivan .................... 359/223 |
| 5,440,397 | A | | 8/1995 | Ono et al. .................. 356/401 |
| 5,493,403 | A | | 2/1996 | Nishi ....................... 356/401 |
| 5,508,518 | A | | 4/1996 | Kendall .................... 250/492.2 |
| 5,563,708 | A | | 10/1996 | Nakai ....................... 356/363 |
| 5,576,895 | A | | 11/1996 | Ikeda ....................... 359/811 |
| 5,581,324 | A | | 12/1996 | Miyai et al. ................ 355/53 |
| 5,623,853 | A | | 4/1997 | Novak et al. ............... 74/490.09 |
| 5,675,413 | A | | 10/1997 | Prikryl et al. .............. 356/345 |
| 5,715,078 | A | | 2/1998 | Shiraishi ................... 359/204 |
| 5,760,564 | A | | 6/1998 | Novak ...................... 318/687 |
| 5,798,530 | A | | 8/1998 | Okumura ................... 250/548 |
| 5,900,105 | A | | 5/1999 | Toshima ................... 156/345 |
| 5,909,030 | A | | 6/1999 | Yoshitake et al. ........... 250/492.2 |
| 5,953,106 | A | | 9/1999 | Unno et al. ................ 355/55 |
| 5,959,427 | A | | 9/1999 | Watson ..................... 318/687 |
| 5,996,437 | A | | 12/1999 | Novak et al. ............... 74/490.09 |
| 6,072,569 | A | | 6/2000 | Bowen ..................... 356/124 |
| 6,208,407 | B1 | | 3/2001 | Loopstra ................... 355/53 |
| 6,325,351 | B1 | | 12/2001 | Hale et al. ................. 248/562 |
| 6,400,516 | B1 | * | 6/2002 | Spinali ..................... 359/819 |

* cited by examiner

Primary Examiner—Stephen D. Meier
Assistant Examiner—Alfred E Dudding
(74) Attorney, Agent, or Firm—Pennie & Edmonds LLP

(57) ABSTRACT

A chuck assembly for use in semiconductor processing equipment includes elements that permit reticle expansion and assembly misalignment without additional reticle deformation. Reticle expansion is allowed by flexible support elements that are positioned to move in the direction of expansion, but that also combine to provide the control necessary for processing. Misalignment is allowed by connections that attach the reticle securely and uniquely to the support elements despite some amount of imperfection in the reticle, or the connections themselves. Accounting in this way for expansion and misalignment prevents additional reticle distortion and thus improves the accuracy of the product.

41 Claims, 4 Drawing Sheets

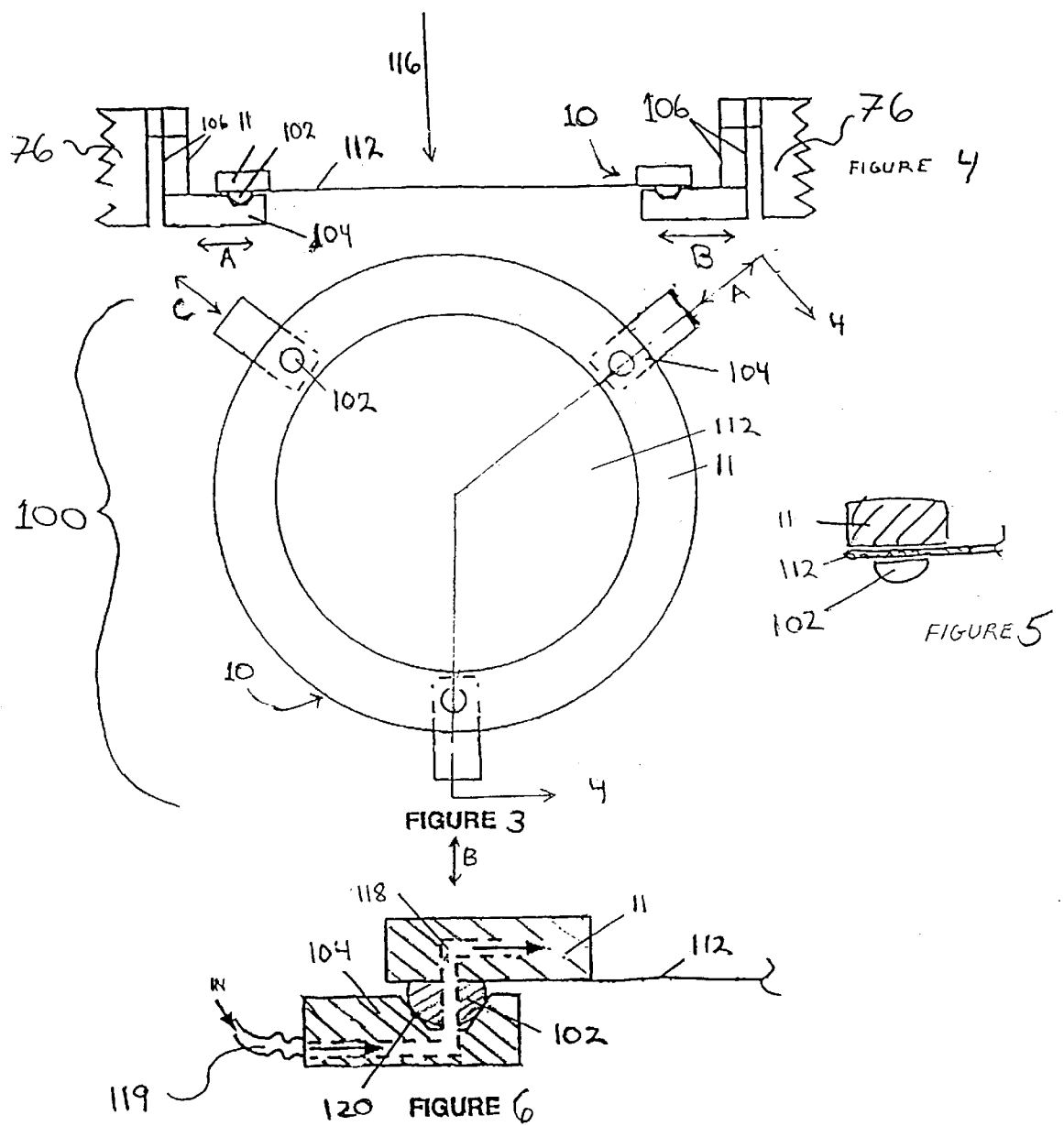

LOW DISTORTION KINEMATIC RETICLE SUPPORT

This application claims benefit of Ser. No. 60/241,671 filed Oct. 18, 2000.

FIELD OF THE INVENTION

The invention relates to photolithography instruments used for patterning and processing substrates such as semiconductor chips and wafers. More specifically, the invention is concerned with reducing distortion of the reticle and the corresponding reticle pattern.

BACKGROUND OF THE INVENTION

Lithography processes require positioning a reticle between an energy beam (typically electron or light) and the substrate chip, or wafer. The reticle must be held without slippage and in a way that does not cause distortion of the reticle pattern. This reticle is typically very thin. This thinness can cause the reticle to deform rather easily even though the reticle usually includes material reinforcing its perimeter, sometimes in the form of a ring secured to its perimeter. If a reticle deforms it can produce an imperfect image on the substrate that results in an imperfect final product.

In modern lithography processes for exposing patterns on wafers and other substrates the reticle is moved at high speeds between discrete and precise positions to facilitate focusing the image on the substrate. This motion can generate dynamic reaction forces where the reticle is supported, leading to distortion of the reticle and, hence, distortion of the image focused on the substrate. It is therefore critical that the reticle be chucked in a manner that reduces or eliminates such reaction forces. The problem is complicated by the fact that lithography processes may occur in a clean room vacuum environment, rendering pneumatic chucks ineffective.

Various attempts to address this difficulty have been less than successful. For example, reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. These proposed solutions, however, have not provided optimum results.

As the preceding discussion implies, a lithography process is a complex interaction of sensitive subsystems. The reticle and chuck assembly subsystem is sensitive to numerous inputs. Many things can contribute to the distortion of the reticle such as motion or vibration of the support structure for the reticle, or heat from an electron beam, which may cause thermal expansion. Prior art chuck assemblies can impart stresses where they clamp the reticle. In addition, such chuck assemblies that hold the reticle rigidly in all dimensions can compound deformation caused by thermal expansion by forcing the reticle to twist or bow as it expands.

Other known methods of holding the reticle are often also not satisfactory solutions. Electrostatic methods of holding the reticle such as described in U.S. Pat. No. 5,532,903 to Kendall can be less secure than necessary considering the accelerations of 40 m/sec$^2$ or more that the reticle undergoes during the lithographic process. Vacuum methods of holding the reticle are ineffective in processes because typically the process itself is conducted in a vacuum.

Thus, there is a continuing need in the art for a chucking assembly and method for the reticle retention that eliminates the stresses involved with mechanical clamping and allows for thermal expansion, while simultaneously holding the reticle with enough force that the reticle accelerations associated with the process do not degrade the final product.

SUMMARY OF THE INVENTION

The present invention provides a chuck assembly for connecting a reticle to a stage while limiting distortion of the reticle and while still allowing movement with the stage. The chuck assembly includes a number of connector members secured to the stage where each member permits a seat to translate along a single axis in a plane parallel to the movement of the stage. The chuck assembly also includes protrusions that are secured to the reticle and that are also received by the seats on connector members. Using the protrusion and seat arrangement removes or reduces clamping forces as a source of reticle distortion. The interface between protrusion and seat also allows for some degree of misalignment while still providing the degree of retention and control necessary to position the reticle.

BRIEF DESCRIPTION OF THE DRAWINGS

The foregoing and other aspects and advantages will be better understood from the following detailed description of the preferred embodiment of the invention with reference to the drawings, in which:

FIG. 3 is a top view of a chuck assembly according to an embodiment of the present invention;

FIG. 4 is a cross-sectional side view along line 4—4 in FIG. 3;

FIG. 5 is a cross-sectional side view illustrating an embodiment of the reticle-protrusion sub-assembly according to the invention;

FIG. 6 is a partial cross-sectional view of an alternative embodiment of the invention.

DETAILED DESCRIPTION OF THE PREFERRED EMBODIMENTS

Figure 1:
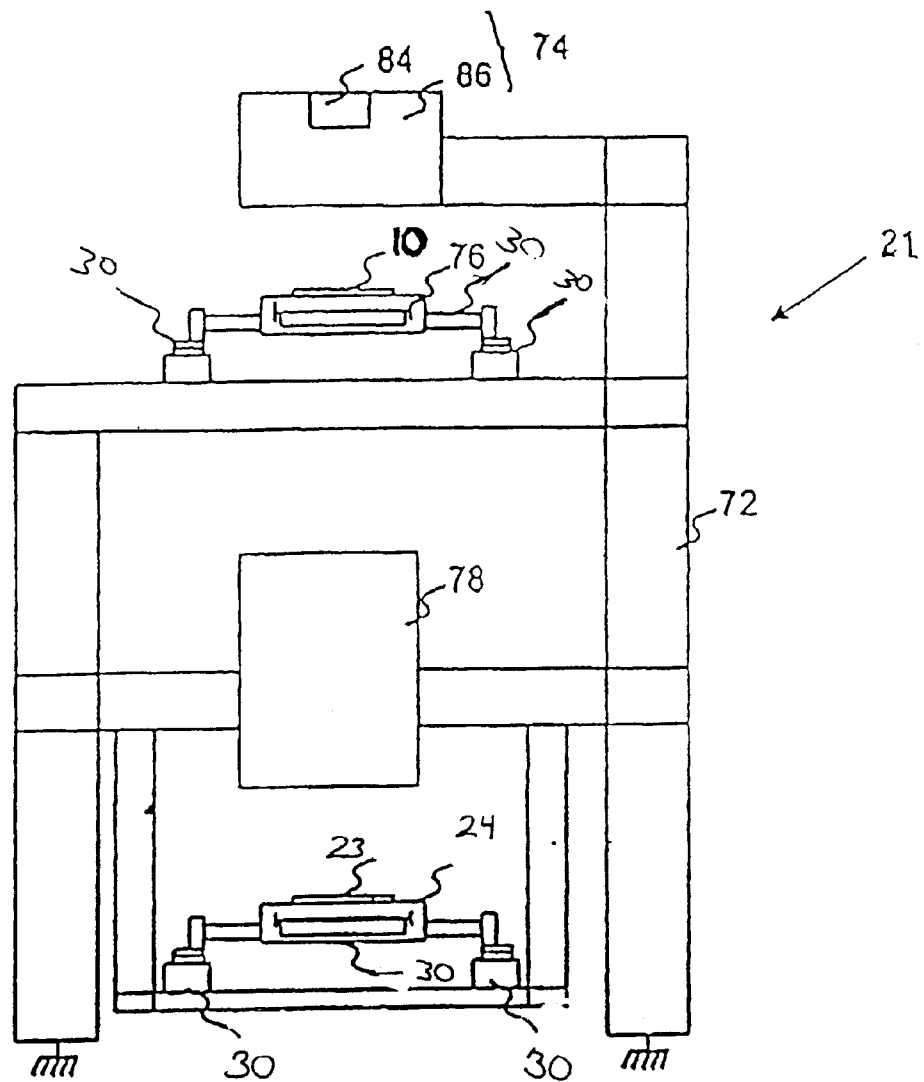
FIG. 1 is a side view of an alternate lithography exposure apparatus employing the present invention.
Figure 2:
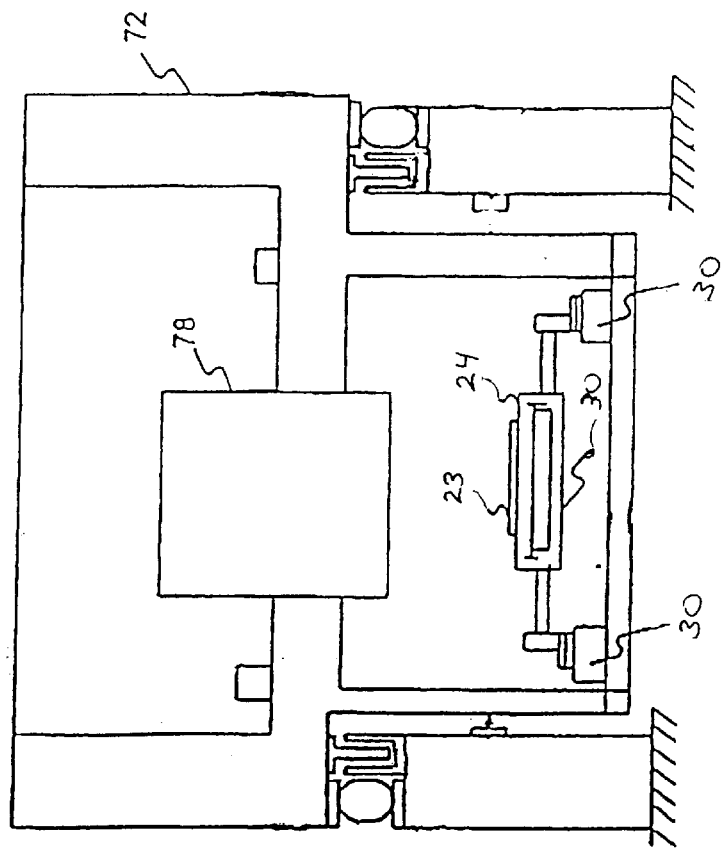
FIG. 2 is a different side view of an alternate lithography exposure apparatus employing the present invention.

Referring to FIGS. 1 and 2, a lithography exposure apparatus 21 may be used to employ the present invention. In doing so exposure apparatus 21 transfers a pattern of an integrated circuit from reticle 10 onto semiconductor wafer 23. According to the present invention, reticle 10 is mounted on a kinematic support structure, as described in greater detail below, in order to reduce or eliminate distortion of the reticle during the photolithography process.

Apparatus frame 72 preferably is rigid and supports the components of the exposure apparatus, but can be varied to suit the design requirements for a particular application. Apparatus frame 72 generally supports reticle stage 76, wafer stage 24, lens assembly 78, and illumination system 74. Alternatively, for example, separate, individual structures (not shown) can be used to support wafer stage 24 and reticle stage 76, illumination system 74, and lens assembly 76.

Illumination system 74 includes an illumination source 84 and an illumination optical assembly 86. Illumination source 84 emits an exposing beam of light energy. Optical assembly 86 guides the beam of light energy from illumination source 84 to lens assembly 78. The beam illuminates selectively different portions of reticle 10 and exposes wafer 23. In FIG. 1, illumination source 84 is illustrated as being supported above reticle stage 76. Typically, however, illumination source 84 is secured to one of the sides of apparatus frame 72 and the energy beam from illumination source 84 is directed to above reticle stage 76 with illumination optical assembly 86.

Lens assembly 78 projects and/or focuses the light passing through reticle 10 to wafer 23. Depending upon the design of apparatus 21, lens assembly 78 can magnify or reduce the image illuminated on reticle 10.

Reticle stage 76 holds and precisely positions reticle 10 relative to lens assembly 78 and wafer 23. Similarly, wafer stage 24 holds and positions wafer 23 with respect to the projected image of the illuminated portions of reticle 10. In the embodiment illustrated in FIG. 1 and FIG. 2, wafer stage 24 and reticle stage 76 are positioned by shaft-type linear motors 30. Depending upon the design, apparatus 21 may include additional servo drive units, linear motors and planar motors to move wafer stage 24 and reticle stage 76, but other drive mechanisms may be employed.

The basic device as described may be used in different types of lithography processes. For example, exposure apparatus 21 can be used in a scanning type photolithography system that exposes the pattern from reticle 10 onto wafer 23 with reticle 10 and wafer 23 moving synchronously. In a scanning type lithography process, reticle 10 is moved perpendicular to an optical axis of lens assembly 78 by reticle stage 76, and wafer 23 is moved perpendicular to an optical axis of lens assembly 78 by wafer stage 24. Scanning of reticle 10 and wafer 23 occurs while reticle 10 and wafer 23 are moving synchronously.

Alternatively, exposure apparatus 21 may be employed in a step-and-repeat type photolithography system that exposes reticle 10 while reticle 10 and wafer 23 are stationary. In the step-and-repeat process, wafer 23 is in a constant position relative to reticle 10 and lens assembly 78 during the exposure of an individual field. Subsequently, between consecutive exposure steps, wafer 23 is consecutively moved by wafer stage 24 perpendicular to the optical axis of lens assembly 78 so that the next field of semiconductor wafer 23 is brought into position relative to lens assembly 78 and reticle 10 for exposure. Following this process, the images on reticle 10 are sequentially exposed onto the fields of wafer 23.

Referring now to FIG. 3, chuck assembly 100 according to the invention is illustrated. Chuck assembly 100 provides for connection of reticle 10 or similar objects to a frame such as stage 76, while limiting reaction forces and distortion of the object which might otherwise result from movement of the stage. Chuck assembly 100 generally comprises a plurality of protrusions 102 received in seats 104, which are supported by a pair of flexures 106. As explained further below, this arrangement may be employed advantageously in other assemblies wherein an object other than a reticle must be restrained and distortion of that object must be addressed. For example, the present invention could be used in mechanisms experiencing less acceleration, which would allow the cone-angle of the present embodiment to be relaxed and thus reduce the friction of the protrusion in the seat, resulting in further reduction of object distortion. In a preferred embodiment three connector members may be equally spaced around the circular reticle.

As shown in FIG. 5, reticle 10, according to one embodiment of the invention, comprises reticle ring 11 secured to the top of reticle membrane 112, or mask. Protrusions 102 are secured to the bottom of reticle membrane 112. Protrusions 102 may be secured, for example, by being bonded to reticle membrane 112. Alternatively, protrusions 102 may be bonded to, or incorporated directly into, reticle ring 11 and projected through openings in the reticle membrane 112. Additionally, the positions of reticle ring 11 and reticle membrane 112 could be reversed allowing protrusions 102 to be bonded directly to reticle ring 11 without having to account for reticle membrane 112.

Protrusions 102 are preferably evenly distributed along the periphery of reticle membrane 112 and total three in number. In a preferred embodiment, hemispherical protrusions 102 are set into and are supported by seats 104 of conical cross-section. The interface between protrusion 102 and seat 104 permits some degree of misalignment while still providing the degree of control necessary to position the reticle. In an alternate preferred embodiment, the relative positions of seat 104 and protrusion 102 are reversed, with seat 104 being set into reticle 10.

Seats 104 are in turn connected to flexures 106. Flexures 106 are members that limit each seat 104 to translation in its specific radial direction as indicated by arrows A, B and C. Flexures 106 are in turn supported by reticle stage 76 itself. Flexures may be, for example, a pair of flexible plates that permit bending only in one direction and resist rotation. Flexures may also be rigid members equipped with a mechanism that allows the seat to travel in a desired direction, but no other.

It should be understood that the combined effect of limiting seats 104 to radial translations A, B, and C is that a reticle is allowed to undergo planar expansion without the resulting stresses that would occur if protrusions 102 were constrained in the direction of planar expansion. Without these stresses there is reduced opportunity for the reticle to deform. The combined effect of limiting seats 104 to radial travel A, B and C still allows the control necessary to use the chuck assembly to position the reticle.

Similarly, the ability of the interface between protrusions 102 and seat 104 to permit some degree of misalignment works to minimize the effect of that misalignment on the reticle. For example, where a hypothetical localized deformation of the reticle would cause a misalignment, that deformation would not cause a general deformation of the reticle if the misalignment fell within the range permitted by the interface. This same hypothetical deformation could have caused a general deformation had, for example, a clamp been used.

It should also be understood that it is preferable for flexures 106 perform their function with as little friction as possible. Frictionless travel in the direction allowed by the flexures 106 causes less stress to remain in the reticle 10 while still allowing the control necessary to position reticle 10. In a preferred embodiment, flexures 106 are composed of twin, flat, members that are very flexible in only one direction. These members are then oriented in parallel to support seat 104, yet constrain seat 104 to radial motion.

As shown in FIG. 4, incident electron beam 116 is generally perpendicular to reticle membrane 112 and the direction of isolated translation (arrows A, B) allowed by flexures 106. This side view clearly shows hemisphere-shaped protrusions 102 received in seats 104. This arrangement permits seat 104 to receive protrusion 102 should reticle membrane 112 or reticle ring 11 be non-planar (deformed) in a way inducing misalignment. Other configurations of protrusions and seats that also provide these advantages may be used. For example, it is contemplated that seats 104 could be holes that receive cone-shaped protrusions 102.

Whatever configuration used should permit the reticle to move where it is in contact with the chuck assembly, but this movement must be limited. Translation of each contact point should be limited to account for in-plane radial distortion of the reticle, or account for misalignment of the seats and protrusions. According to a preferred embodiment, where the reticle is a planar circle and contact points are three in number and are evenly spaced about the periphery of the reticle, the allowed translation would typically be in the reticle plane along axes that originate at the contact points and intersect near the center of the reticle. This arrangement allows in-plane expansion and contraction of the reticle without causing net translation with respect to the reticle stage. If a chuck assembly should prevent such in-plane expansion and contraction at the contact points, it would be contributing to stresses causing the reticle to bow or twist. Care should also be taken to design the chuck assembly so that in-plane accelerations caused by the photolithography process do not get converted into out-of-plane translation.

A preferred embodiment of the invention contemplates meeting these requirements by setting protrusions 102 into conical seats 104 having a vertex angle of between about 15 to 45 degrees and more preferably about 20 to 40 degrees. The probability of out-of-plane translation decreases when the vertex increases, as does the ability of the protrusion to rotate relative to the seat. Thus, the vertex must be adjusted to account for reticle accelerations and degrees of expected distortion. Alternatively, seat 104 may be a cylindrical hole to provide line contact with the spherical protrusions.

FIG. 6 illustrates a further alternative embodiment of the invention. As shown in FIG. 6, conduit 118 is provided within seat 104, protrusion 102, and reticle ring 11. Conduit 118 permits gas or liquid to be circulated within the ring to control the temperature. The fluid flows in through one seat and exits via a different seat. Flexible hose 119 is provided as supply and return for the fluid. The return is provided by a separate conduit similar to that shown in FIG. 6, the only difference being the direction of flow. This flow provides control of the reticle temperature. Line contact 120 between the hemisphere-shaped protrusion 102 and conical seat 104 provides the seal, provided the pressure is kept low enough that it does not cause the protrusion to lift off the seat.

Figure 7:
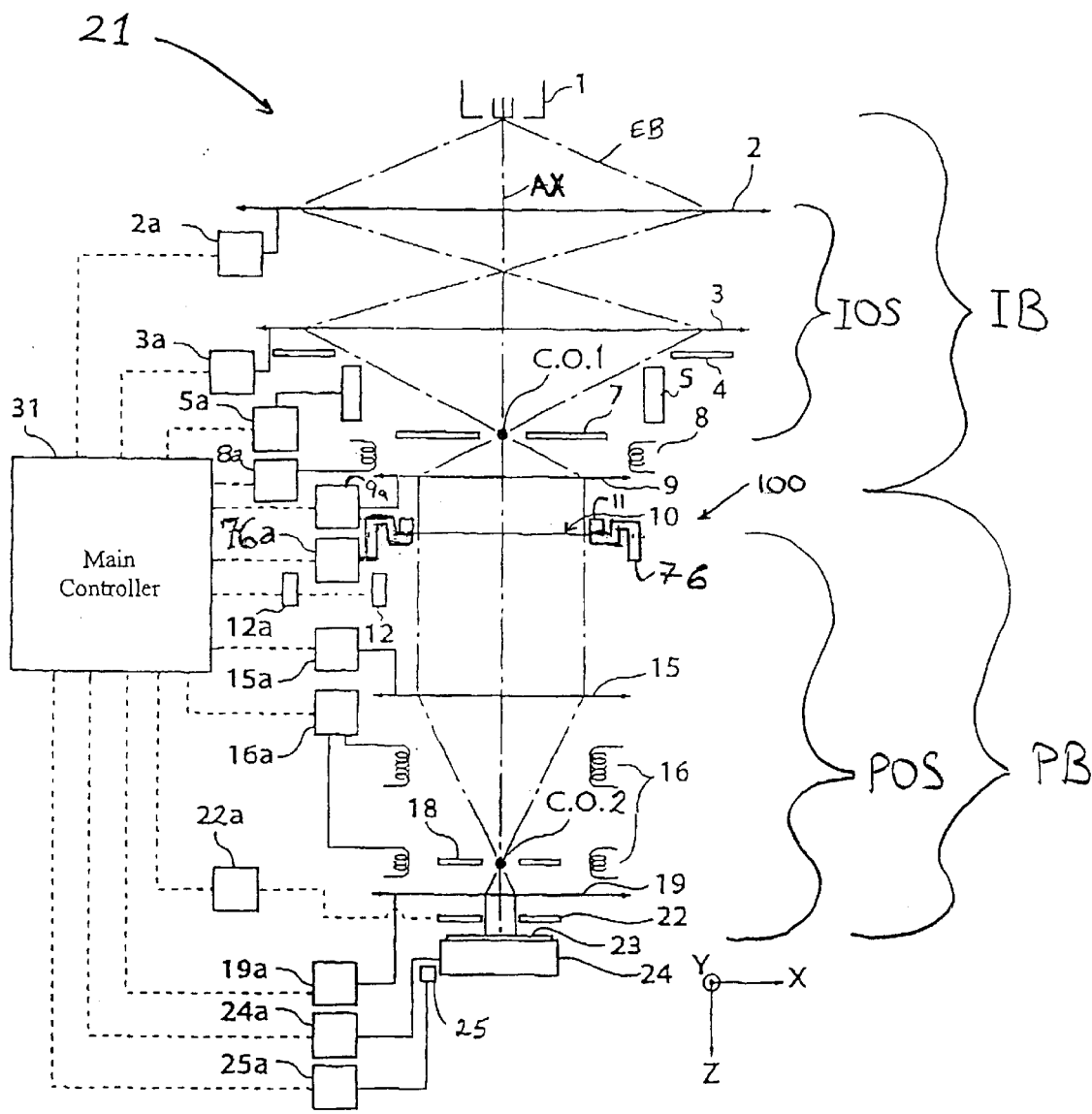
FIG. 7 is a schematic elevational depiction of the principal components of the optical system and associated control systems of a conventional divided-reticle electron beam microlithography apparatus according to the present invention.

In a preferred embodiment of the invention as described above chuck assembly 100 is employed in an electron beam lithography exposure apparatus 21 as is shown in FIG. 7. This figure depicts the type of exposure apparatus known as a conventional divided-reticle electron-beam microlithography system in which the illumination source is electron gun 1. Difficulties encountered in electron beam lithography include heat build-up that can cause the deformation of reticle 10 that the present invention may alleviate.

In this apparatus electron gun 1 emits electron beam EB that propagates along optical axis AX toward first and second condenser lenses 2, 3 respectively. The optical path for the electron beam is typically in a vacuum. The electron beam EB then passes through condenser lenses 2, 3 to form crossover image C.O.1. Crossover image C.O.1 is located on optical axis AX at blanking aperture 7.

Beam-shaping aperture 4 is situated between second condenser lens 3 and blanking aperture 7. Beam-shaping aperture 4 creates an opening that is sized and shaped to pass only the portion of electron beam EB necessary to illuminate a single exposure unit ("subfield") of downstream reticle 10. For example, if the subfields on reticle 10 are rectangular in shape (and each subfield is usually sized and shaped identically) then beam-shaping aperture 4 defines a corresponding rectangular opening as viewed axially. If the subfields on reticle 10 are square in shape and have an area of, for example, 1 $mm^2$, then beam-shaping aperture 4 defines an opening that provides the electron beam, as seen by the reticle, with a square transverse profile where each side of the square is slightly greater than 1 mm. Collimating lens 9, which is situated between blanking aperture 7 and reticle 10, forms on reticle 10 an image of the opening defined by beam-shaping aperture 4.

The portion of electron beam EB propagating between electron gun 1 and reticle 10 is termed herein "illumination beam" IB. The portion of the electron-optical system comprising the lenses 2, 3, 9, the apertures 4, 7, blanking deflector 5, and selection deflector 8, is termed herein "illumination-optical system" IOS.

Blanking deflector 5 is disposed between beam-shaping aperture 4 and blanking deflector 7. During moments when no exposure is desired, blanking deflector 5 is energized and deflects illumination beam IB laterally so as to cause the entire illumination beam IB to be blocked by blanking aperture 7. Selection deflector 8 is situated between blanking aperture 7 and collimating lens 9. Selection deflector 8 deflects illumination beam IB mainly in the X-, or left-to-right direction (note the non-standard axes orientation shown in the figure) in a scanning manner. Collimating lens 9, situated between selection deflector 8 and reticle 10, collimates illumination beam IB before beam IB illuminates the desired subfield of reticle 10. Scanning the illumination beam IB in this manner illuminates successive subfields on reticle 10 within the field of illumination-optical system IOS. Thus, an image of the opening defined by beam-shaping aperture 4 is focused on reticle 10.

In FIG. 7, only a single subfield (centered on optical axis AX) is shown. Actual reticle 10 extends outward in the X-Y plane and comprises many subfields. In any event, reticle 10 defines a pattern (chip pattern) for a single semiconductor device ("die") to be formed on downstream substrate 23, and each subfield defines a respective portion of the pattern.

As noted above, illumination beam IB is deflected laterally to illuminate successive subfields situated within the field of the illumination-optical system. These multiple subfields in the field of illumination-optical system IOS, however, do not typically constitute the sum total of the surface of substrate 23. Illuminating a subfield situated outside the field of illumination-optical system IOS requires moving reticle 10 relative to illumination-optical system IOS. To facilitate this, reticle 10 is mounted on reticle ring 11, which is in turn affixed to chuck assembly 100, as described above, which is movable in the X and Y directions.

As illumination beam IB passes through the illuminated subfield on reticle 10, electron beam EB becomes capable of forming an image of the illuminated subfield on substrate 23. Electron beam EB is therefore termed "patterned beam" PB after it propagates through reticle 10. The electron-optical system located between reticle 10 and substrate 23 is primarily concerned with projecting patterned beam PB onto the desired location on substrate 23. That portion of the electron-optical system is therefore termed "projection-optical system" POS.

Projection-optical system POS includes first and second projection lenses 15, 19, respectively, that are typically configured as a "symmetric magnetic doublet" (SMD). First and second projection lenses 15, 19 operate in concert to form a reduced image of the illuminated reticle subfield on substrate 23. This reduced image is smaller than, or demagnified relative to, the corresponding illuminated subfield of reticle 10 by a factor termed the "demagnification ratio." The demagnification ratio is a factor such as ¼ or ⅕. Projection-optical system POS also includes deflector 16. Deflector 16 deflects patterned beam PB laterally to form the image of the illuminated subfield at the desired location on substrate 23.

The surface of substrate 23 (or "wafer") is coated with an appropriate resist prior to exposure so that patterned beam PB imprints the demagnified image when it illuminates wafer 23. The demagnified images of successively illuminated subfields form a complete die pattern on wafer 23 when all images are contiguous with each other (i.e., a "stitched" together) in the proper order and arrangement. Proper stitching is facilitated by mounting wafer 23 on wafer stage 24, which is moved as required in the X and Y directions and by deflecting patterned beam PB for each image using deflector 16.

First projection lens 15 causes patterned beam PB to form crossover image C.O.2 on the optical axis upstream of second projection lens 19. At crossover image C.O.2, the axial distance between reticle 10 and wafer 23 is divided such that the axial distance from reticle 10 to crossover image C.O.2, divided by the axial distance from crossover image C.O.2 to wafer 23, is equal to the inverse of the demagnification ratio. Crossover image C.O.2 is also the location, along optical axis AX, of contrast aperture 18. Contrast aperture 18 blocks charged particles in patterned beam PB that were scattered previously by illumination beam IB from propagating to wafer 23.

Backscattered-electron (BSE) detector 22 is situated between second projection lens 19 and wafer 23. BSE detector 22 detects backscattered electrons produced when patterned beam PB strikes certain regions (for example, alignment marks or analogous features) on wafer 23. The positions of the alignment marks on wafer 23 are ascertained from characteristics of the BSE signal produced by BSE detector 22. This yields the basic data concerning positions of the reticle and wafer, and alignments between wafer 23 and the electron-optical system or between wafer 23 and reticle 10.

Wafer 23 is preferably mounted on an electrostatic wafer chuck (not shown) that, in turn, is mounted on wafer stage 24. Wafer stage 24 moves the wafer chuck (and thus wafer 23) in the X and Y directions. The various subfields of the chip pattern on reticle 10 can be exposed successively by synchronously moving (or "scanning") reticle stage 76 (illustrated in greater detail in FIGS. 4, 5, 6, and 7) and wafer stage 24 in opposite directions. The axis along which these scans are performed is perpendicular to the axis along which lateral beam scanning is performed using patterned beam PB. The respective positions of stages 76, 24 are determined accurately, in real time, using respective position sensors 12, 25 each employing one or more laser interferometers. Interferometers are typically used because extremely accurate position measurements are required to accurately stitch together the demagnified images.

Lenses 2, 3, 9, 15, 19 and deflectors 5, 8, 16 are controlled by main controller (e.g., microprocessor) 31 via respective coil power supplies, 2a, 3a, 9a, 15a, 19a, 5a, 8a, 16a. Also, reticle stage 76 and wafer stage 24 are controlled by main controller 31 via respective stage drivers 76a, 24a, and position sensors 12, 25 are controlled by main controller 31 via respective interface units 12a, 25a. Data from the BSE detector 22 are routed to main controller 31 via an interface 22a. Main controller 31 determines stage-position control errors and corrects for these using deflector 16, which facilitates accurate stitching.

As will be appreciate by persons skilled in the art, in preferred embodiments discussed herein, it is assumed that the object held, e.g. reticle, is moving in a horizontal plane with gravity acting downward to prevent upward motion. It will be further appreciated that, if an embodiment of the invention is utilized with another orientation, a person skilled in the art may choose to include an additional restraining means, which may include a spring or clamp, to assist in holding the object.

The use of the exposure apparatus described herein is not limited to a photolithography system for semiconductor manufacturing or to an electron beam exposure apparatus. The exposure apparatus, for example, can be used as an LCD photolithography system that exposes a liquid crystal display device pattern onto a rectangular glass plate or a photolithography system for manufacturing a thin film magnetic head. Furthermore, the exposure apparatus and chuck assembly can also be applied to a proximity photolithography system that exposes a reticle pattern by closely locating a reticle and a substrate without the use of a lens assembly. Additionally, an exposure apparatus utilizing a chuck assembly according to the invention can be used in other devices, including other semiconductor processing equipment, machine tools, metal cutting machines, and inspection machines.

While the invention has been described in terms of its preferred embodiments, those skilled in the art will recognize that the invention can be practiced with modification within the scope of the appended claims.

I claim:

1. A chuck assembly for connecting an object to a movable frame, the chuck assembly comprising:
   a plurality of connector members secured to the frame;
   a first restraining member secured to each said connector member, wherein each connector member permits translation of the first restraining member connected thereto along a single axis lying in a plane parallel to the movement of the frame;
   a plurality of second restraining members disposed on the object, each said second restraining member mating with one said first restraining member.

2. The chuck assembly according to claim 1, wherein said frame comprises a lithography apparatus.

3. The chuck assembly according to claim 1, wherein said frame comprises an electron beam apparatus.

4. The chuck assembly according to claim 1, wherein said frame comprises a photolithography apparatus.

5. The chuck assembly according to claim 3 or 4, wherein said protrusions are spherical in a region of contact with said seats and said seats are conical.

6. The chuck assembly according to claim 5, further comprising a ring around the periphery of and supporting the object, wherein said ring defines at least one fluid passage therethrough communicating with said restraining member fluid passage, whereby a temperature control fluid may be circulated within said ring.

7. The chuck assembly according to claim 3 or 4, wherein said protrusions are conical in shape and said seats are holes of diameter smaller than the base of said protrusions.

8. The chuck assembly according to claim 3 or 4, wherein said seats are conical with an angle of the vertex that ranges between about 20 to 40 degrees.

9. The chuck assembly according to claim 1, wherein said connector members are at least approximately equally spaced around the object and said axes intersect at least approximately at the center of the object.

10. The chuck assembly according to claim 1, wherein said first restraining members comprise upstanding protrusions and said second restraining members comprise downwardly open seats receiving said protrusions.

11. The chuck assembly according to claim 1, wherein said first restraining members comprise upwardly open seats and said second restraining members comprise downward protrusions received in said seats.

12. The chuck assembly according to claim 1, wherein said object is at least approximately circular.

13. The chuck assembly according to claim 1, wherein said second restraining members are secured to the object.

14. The chuck assembly according to claim 1, wherein at least one of said first restraining member and second restraining member together define a fluid passage, whereby a fluid may be introduced.

15. A chuck assembly for connecting an object to a movable frame and for limiting distortion of the object, the chuck assembly comprising:
at least three first means for limiting motion of a point on the object to a single linear degree of freedom lying in a plane parallel to the movement of the frame; and
at least three second means for limiting motion of a point on the object to at least three rotational degrees of freedom;
said means cooperating to constrain the object in at least five degrees of freedom relative to the moveable frame while compensating for distortion inducing stresses.

16. The chuck assembly according to claim 15, wherein said first means comprises at least one flexure.

17. The chuck assembly according to claim 15, wherein said first means restrains motion of a point on the object to radial translation in a plane parallel to the movement of the frame.

18. The chuck assembly according to claim 15, wherein said second means comprises:
a plurality of seats secured to the frame through said first means; and
a plurality of protrusions disposed on the object, each protrusion being received in one said seat.

19. The chuck assembly according to claim 15, wherein said second means comprises:
an upstanding protrusion secured to the frame through each of said first means; and
a plurality of seats configured and dimensioned to be secured to the object, each protrusion being received in one said seat.

20. The chuck assembly according to claim 15, wherein at least one of said second means defines a fluid passage therethrough whereby a temperature control fluid may be introduced to the object.

21. The chuck assembly of claim 15, wherein said means to constrain said object relative to said movable frame rely on gravity to constrain said object in a sixth degree of freedom.

22. The chuck assembly of claim 15, wherein said means to constrain said object relative to said movable frame rely on a mechanical device to constrain said object in a sixth degree of freedom.

23. A chuck assembly for connecting the reticle to a stage, comprising:
at least three first restraining members secured to one side of a reticle and spaced about the periphery of said reticle;
plural second restraining members, one each mating with said first restraining members at an interface that permits a degree of misalignment while still providing the degree of retention and control necessary to position the reticle without contributing to the distortion of the reticle; and
a plurality of flexure assemblies comprising two flexures oriented in parallel, each said assembly connected to one said second restraining member that limits each said second restraining member to a predetermined linear motion and where said flexures are themselves connected to a stage.

24. The chuck assembly according to claim 23, wherein each predetermined linear motion is along an axis lying in a plane parallel to the movement of the frame and said axes intersect at least approximately at the center of the object.

25. The chuck assembly according to claim 23, wherein at least one of said first and second restraining members together define a fluid passage therethrough whereby a temperature control fluid may be introduced.

26. A lithography exposure apparatus comprising:
a source of exposing energy;
a first object containing a desired pattern;
a second object to receive said pattern from said first object;
an apparatus for propagating said exposing energy to said first object and subsequently propagating said exposing energy containing said pattern to said second object wherein said apparatus further comprises a chuck assembly for connecting said first object to a movable frame, the chuck assembly comprising:
a plurality of connector members secured to the frame;
a first restraining member secured to each said connector member, wherein each connector member permits translation of the first restraining member connected thereto along a single axis lying in a plane parallel to the movement of the frame;
a plurality of second restraining members disposed on the object, each said second restraining member mating with one said first restraining member.

27. The lithography exposure apparatus of claim 26, wherein said source of exposing energy is an electron beam.

28. The lithography exposure apparatus of claim 26, wherein said source of exposing energy is light energy.

29. A method for supporting an object on a moveable frame, wherein the object has a center and a perimeter, and the frame is moveable within a plane, said method comprising:
supporting the object on the frame at a plurality of support points along the object perimeter; and
permitting each said support point to position itself along a predefined axis parallel to said plane of movement.

30. The method according to claim 29, wherein said predefined axes intersect at least approximately at the center of the object.

31. The method according to claim 29, wherein said supporting comprises supporting the object at three points.

32. The method according to claim 29, wherein said plurality of support points prevents said object from rotating relative to said frame.

33. A method for lithography, comprising supporting a lithography pattern on a moveable frame, wherein said pattern has a center and a perimeter, and the frame is moveable within a plane, and wherein said pattern is supported at a plurality of points along the object perimeter;

permitting each said support point to position itself along a predefined axis parallel to said plane of movement;

exposing a wafer to a portion of the lithography pattern; and moving the frame to expose the wafer to another portion of the lithography pattern, wherein said supporting and permitting reduce distortion in said lithography pattern due to said moving.

34. The method according to claim 33, wherein said predefined axes intersect at least approximately at the center of the lithography pattern.

35. The method according to claim 33, wherein said supporting comprises supporting the object at least at three points.

36. The method according to claim 33, wherein support points permit local rotation of the lithography pattern at the point of support.

37. The method according to claim 33, wherein said exposing comprises projecting a light beam through the lithography pattern.

38. The method according to claim 33, wherein said exposing comprises projecting an electron beam through the lithography pattern.

39. The method according to claim 38, wherein said supporting and permitting reduce distortion in said pattern due to said exposing.

40. A method for connecting an object to a movable frame and for limiting distortion of the object, the method comprising:

supporting the object about a plurality of points along said object's perimeter;

allowing said points of support to move as a result of forces originating from said object; and constraining the allowed translation of said points of support to translation in a single axis lying in a plane parallel to the movement of the frame.

41. The method of claim 40, said method further comprising constraining the allowed rotation of said points of support.

* * * * *